United States Patent
Adusumilli et al.

(10) Patent No.: US 10,163,679 B1
(45) Date of Patent: Dec. 25, 2018

(54) SHALLOW TRENCH ISOLATION FORMATION WITHOUT PLANARIZATION

(71) Applicant: GLOBALFOUNDRIES Inc., Grand Cayman (KY)

(72) Inventors: Siva P. Adusumilli, South Burlington, VT (US); Steven M. Shank, Jericho, VT (US); Richard A. Phelps, Colchester, VT (US); Anthony K. Stamper, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/609,742

(22) Filed: May 31, 2017

(51) Int. Cl.
| | | |
|---|---|---|
| *H01L 21/76* | (2006.01) | |
| *H01L 21/762* | (2006.01) | |
| *H01L 21/02* | (2006.01) | |

(52) U.S. Cl.
CPC .... *H01L 21/76229* (2013.01); *H01L 21/7624* (2013.01); *H01L 21/76235* (2013.01); *H01L 21/0262* (2013.01)

(58) Field of Classification Search
CPC .......... H01L 27/1203; H01L 21/76264; H01L 21/823481; H01L 21/76229; H01L 21/76235; H01L 21/7624; H01L 21/0262; H01L 29/0603; H01L 29/7846; H01L 21/762
USPC ..... 257/E27.112, E21.55, E21.552; 438/435, 438/424, 440, 423, 443, 444
See application file for complete search history.

(56) References Cited

U.S. PATENT DOCUMENTS

| | | | | |
|---|---|---|---|---|
| 5,369,051 A | | 11/1994 | Rao et al. | |
| 5,372,950 A | * | 12/1994 | Kim | H01L 21/32 257/E21.258 |
| 5,439,836 A | * | 8/1995 | Giffard | H01L 29/66772 148/DIG. 150 |
| 5,563,091 A | | 10/1996 | Lee | |
| 5,574,292 A | * | 11/1996 | Takahashi | G02F 1/13454 257/103 |
| 5,972,777 A | * | 10/1999 | Hsu | H01L 21/76213 257/E21.258 |

(Continued)

OTHER PUBLICATIONS

Wang et al., "The Behavior of Narrow-Width SOI MOSFET's with MESA Isolation" IEEE Transactions on Electron Devices, vol. 47, No. 3, Mar. 2000.

*Primary Examiner* — Thao X Le
*Assistant Examiner* — Nduka Ojeh
(74) *Attorney, Agent, or Firm* — Thompson Hine LLP; Anthony Canale

(57) ABSTRACT

Structures for shallow trench isolation regions and methods for forming shallow trench isolation regions. A trench is etched partially through a device layer of a silicon-on-insulator substrate. A section of the device layer at a bottom of the trench is thermally oxidized to form a shallow trench isolation region in the trench. During the thermal oxidation, another region of the device layer may be concurrently oxidized over a partial thickness and, after removal of the oxide from this device layer region, used as a thinned silicon body. Prior to the thermal oxidation process, this device layer region may be implanted with an oxidation-retarding species that decreases its oxidation rate in comparison with the oxidation rate of the section of the device layer used to form the shallow trench isolation region.

12 Claims, 3 Drawing Sheets

(56) References Cited

U.S. PATENT DOCUMENTS

| | | | |
|---|---|---|---|
| 6,190,952 B1 * | 2/2001 | Xiang | H01L 21/84 |
| | | | 257/E21.703 |
| 6,258,694 B1 * | 7/2001 | Wang | H01L 21/76205 |
| | | | 257/E21.553 |
| 7,358,571 B2 | 4/2008 | Ko et al. | |
| 8,084,305 B2 | 12/2011 | Ko et al. | |
| 8,383,490 B2 | 2/2013 | Fan et al. | |
| 9,136,386 B2 | 9/2015 | Okihara | |
| 9,214,561 B2 | 12/2015 | Abou-Khalil et al. | |
| 2002/0053715 A1 * | 5/2002 | Kim | H01L 21/3086 |
| | | | 257/524 |
| 2002/0132423 A1 * | 9/2002 | Tsao | H01L 27/1087 |
| | | | 438/243 |
| 2006/0022270 A1 | 2/2006 | Boyd et al. | |

* cited by examiner

SHALLOW TRENCH ISOLATION FORMATION WITHOUT PLANARIZATION

BACKGROUND

The present invention relates to semiconductor device fabrication and integrated circuits and, more specifically, to structures for shallow trench isolation regions and methods of forming structures for shallow trench isolation regions.

Complementary-metal-oxide-semiconductor (CMOS) processes may be used to build a combination of p-type field-effect transistors (pFETs) and n-type field-effect transistors (nFETs) that are coupled to implement logic gates and other types of integrated circuits, such as switches. Field-effect transistors generally include a body region, a source and a drain defined in the body region, and a gate electrode associated with a channel in the body region. When a control voltage exceeding a designated threshold voltage is applied to the gate electrode, carrier flow occurs in an inversion or depletion layer in the channel between the source and drain to produce a device output current.

Silicon-on-insulator (SOI) substrates may be advantageous in CMOS technology. In comparison with field-effect transistors built using a bulk silicon wafer, a silicon-on-insulator substrate permits field-effect transistors to operate at significantly higher speeds with improved electrical isolation and reduced electrical losses. Contingent on the thickness of a device layer of the SOI substrate, a field-effect transistor may operate in a partially-depleted mode in which the depletion layer in the channel within the body region does not extend fully to the buried oxide layer when typical control voltages are applied to the gate electrode.

The device layer may be divided into active regions using shallow trench isolation regions that intersect the buried layer of the SOI substrate. Shallow trench isolation regions may be fabricated by etching a pattern of trenches in the device layer, and depositing one or more layers of dielectric material to fill the trenches. The one or more layers must be planarized using chemical-mechanical polishing (CMP) to remove excess dielectric material that is deposited on surfaces outside of the trenches. Other techniques, such as LOCOS (local oxidation of silicon) and mesa isolation, are available to form shallow trench isolation without the assistance of CMP. The shallow trench isolation regions define the active regions, and provide electrical isolation between active regions in the device layer in which device structures, such as field-effect transistors, are formed.

Improved structures for shallow trench isolation regions and methods for forming shallow trench isolation regions are needed.

SUMMARY

In an embodiment of the invention, a method includes etching a trench partially through a device layer of a silicon-on-insulator substrate, and thermally oxidizing a section of the device layer at a bottom of the trench to form a shallow trench isolation region in the first trench.

During the thermal oxidation, another region of the device layer may be concurrently oxidized over a partial thickness and, after removal of the oxide from this device layer region, used as a thinned silicon body. Prior to the thermal oxidation process, this device layer region may be implanted with an oxidation-retarding species that decreases its oxidation rate in comparison with the oxidation rate of the section of the device layer used to form the shallow trench isolation region.

In an embodiment of the invention, a structure includes a shallow trench isolation region extending through a device layer of a silicon-on-insulator substrate to a buried oxide layer of the silicon-on-insulator substrate. The device layer includes a tail region that extends beneath a curved region of the shallow trench isolation region and that has a curvature that is complementary to the curved region of the shallow trench isolation. The tail region is located in a vertical direction between the curved region of the shallow trench isolation region and the buried oxide layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
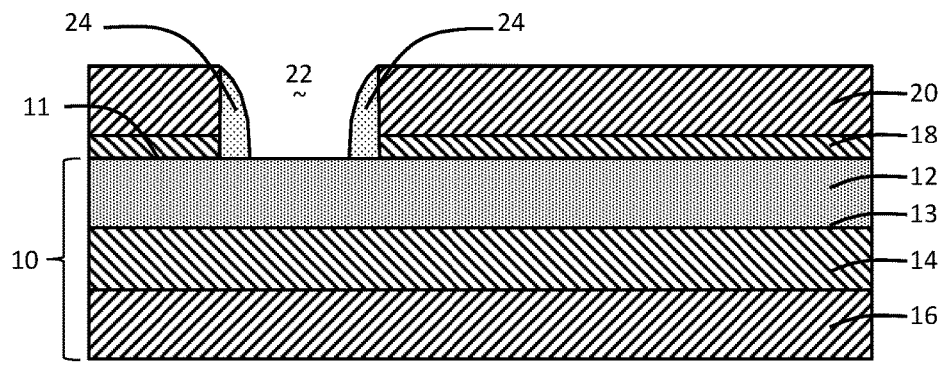
FIGS. 1-7 are cross-sectional views of a device structure at successive fabrication stages of the processing method in accordance with embodiments of the invention.

With reference to FIG. 1 and in accordance with an embodiment of the invention, a substrate 10 in the representative form of a silicon-on-insulator (SOI) substrate includes a device layer 12, a buried oxide (BOX) layer 14 comprised of an oxide of silicon (e.g., $SiO_2$), and a handle wafer 16. The device layer 12 and BOX layer 14 terminate at the rim of the handle wafer 16. The device layer 12 is separated from the handle wafer 16 by the intervening BOX layer 14 and may be substantially thinner than the handle wafer 16. The device layer 12 is electrically isolated from the handle wafer 16 by the BOX layer 14. The device layer 12 and the handle wafer 16 may be comprised of a single crystal semiconductor material, such as silicon. The BOX layer 14 has a top surface in direct contact with the device layer 12 along an interface and a bottom surface in direct contact with the handle wafer 16 along another interface, and these surfaces are separated by the thickness of the BOX layer 14. The handle wafer 16 may be lightly doped to have, for example, p-type conductivity.

The handle wafer 16, or a replacement wafer provided in a wafer transfer process, may be modified at its top surface by adding a layer comprised of a trap-rich material, such as a polycrystalline semiconductor material (e.g., polysilicon) or another type of engineered low-mobility silicon layer. The layer may be deposited by chemical vapor deposition (CVD) under deposition conditions (e.g., temperature and pressure) selected to impart a high density of electrically-active carrier traps.

Pad layers 18, 20 are located on a top surface of device layer 12. The materials forming the pad layers 18, 20 may be chosen to etch selectively to the semiconductor material constituting the device layer 12 and to be readily removed at a subsequent fabrication stage. The pad layers 18, 20 operate as protection layers for the top surface of the device layer 12 during, for example, etching processes. Pad layer 18 may be composed of a dielectric material, such as silicon dioxide ($SiO_2$) grown by oxidizing the top surface of device layer 12 or deposited by chemical vapor deposition (CVD). Pad layer 20 may be composed of a dielectric material, such as silicon nitride ($Si_3N_4$) deposited by CVD.

The pad layers 18, 20 are patterned to define a trench 22 that penetrates through the full thickness of the pad layers 18, 20 to the top surface of the device layer 12. The pad layers 18, 20 may be patterned to form a hardmask by applying a photoresist layer (not shown) on pad layer 20, lithographically patterning the photoresist layer to define an opening in the patterned photoresist layer, and transferring the opening from the photoresist layer to the pad layers 18, 20 with an etching process. The photoresist layer may be stripped after the trench 22 is formed in the pad layers 18, 20, followed by a conventional cleaning process.

Spacers 24 are formed inside the trench 22 by depositing a conformal layer of, for example, silicon nitride ($Si_3N_4$) and etching with an anisotropic etching process, such as ME, that preferentially removes the dielectric material of conformal layer from horizontal surfaces and stops on the semiconductor material of the device layer 12. The spacers 24 are formed along the side edges of the trench 22, and extend vertically to the top surface of the device layer 12.

Figure 2:
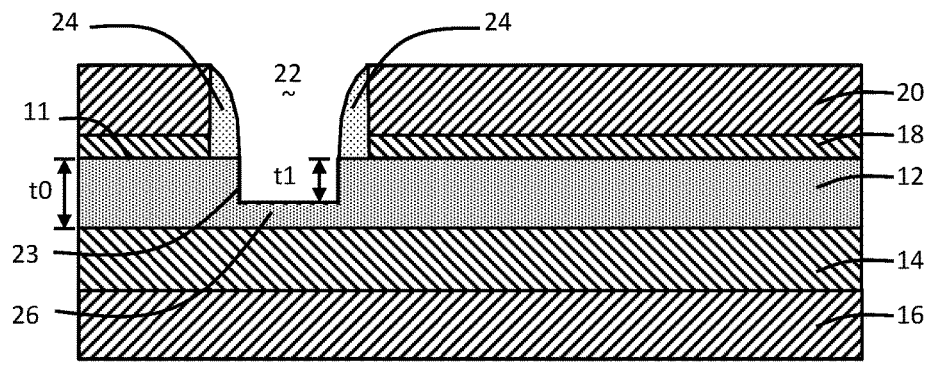

With reference to FIG. 2 in which like reference numerals refer to like features in FIG. 1 and at a subsequent fabrication stage of the processing method, the device layer 12 is recessed over the area of the trench 22 using an etching process, such as a reactive ion etching (ME) process that is directional. The section of the trench 22 in the device layer 12 has sidewalls 23 that extend vertically from the top surface 11 of the device layer 12 The partial etching process extends the trench 22 only partially through the device layer 12 such that a section or strip 26 of the device layer 12 has a thickness, t1, relative to the top surface 11 of the device layer 12 that is less than the full thickness, t0, of the device layer 12. The spacers 24 provide self-alignment when the trench 22 is extended vertically into the device layer 12. The depth of the vertical recessing, given by the difference in the thicknesses between the strip 26 and the device layer 12, may be tunable through control over the etching process. Sidewalls 23 extend over the depth of the trench 22 to intersect the strip 26 at its peripheral edges and are bordered by the semiconductor material of the device layer 12.

Figure 3:
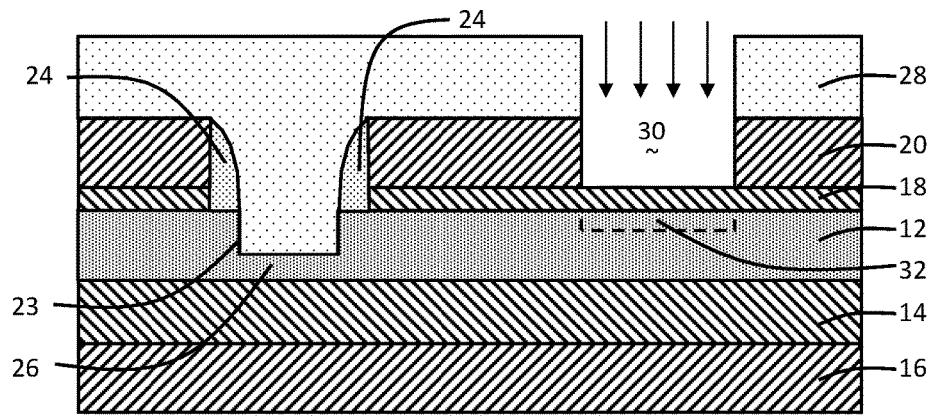

With reference to FIG. 3 in which like reference numerals refer to like features in FIG. 2 and at a subsequent fabrication stage of the processing method, a mask 28 is formed on the top surface of the pad layer 20. The mask 28 may comprise a photoresist that is applied as a coating by a spin coating process, pre-baked, exposed to light projected through a photomask, baked after exposure, and developed with a chemical developer to form an opening. The opening in the mask 28 is transferred from the mask 28 to the pad layer 20 with an etching process to form a trench 30 in the pad layer 20. The mask 28 fills the trench 22 such that the trench 22 is not extended to a greater depth into the device layer 12 when the trench 30 is formed in the pad layer 20.

The device layer 12 over the area of the trench 30 is implanted with ions, shown diagrammatically as singleheaded arrows, to introduce an atomic species as an impurity into the constituent semiconductor material that is effective to modify the oxidation rate of the implanted region 32. In an embodiment, the implantation may deliver ions of an atomic species, such as nitrogen (N), in a concentration that is effective to reduce the oxidation rate of the semiconductor material constituting the device layer 12. The ions may be generated from a suitable source gas and implanted with selected implantation conditions (e.g., ion species, dose, kinetic energy) using an ion implantation tool. The thickness of the mask 28 is sufficient to stop the ions and prevent the strip 26 of the device layer 12 from receiving a dose of the ions. The pad layer 18 may function as a screen layer to protect the top surface of the device layer 12 over the area of the trench 30 during implantation. In an alternative embodiment, the pad layer 18 may be removed before the implantation.

Figure 4:
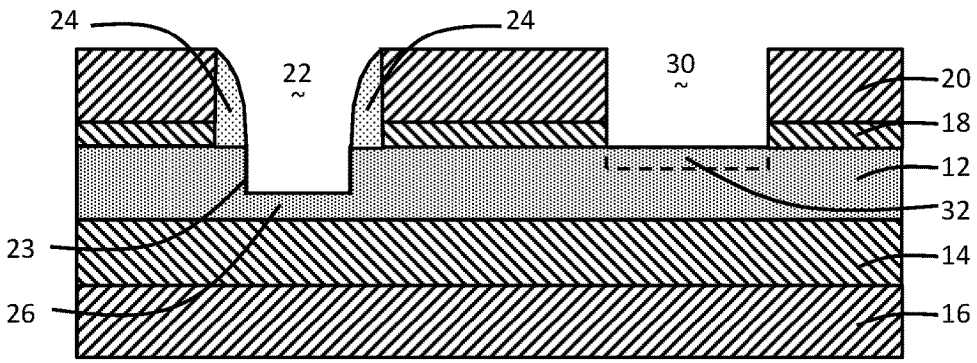

With reference to FIG. 4 in which like reference numerals refer to like features in FIG. 3 and at a subsequent fabrication stage of the processing method, the mask 28 may be stripped after the implanted region 32 is formed in the device layer 12, followed by a conventional cleaning process. The pad layer 18 may be stripped over the area of the trench 30 with a wet chemical etching process (e.g., buffered hydrofluoric acid) so that the trench 30 is extended vertically to the top surface of the device layer 12. As a result, the trench 22 is opened to again reveal the strip 26 of the device layer 12. In an alternative embodiment, the removal of the pad layer 18 may be omitted.

Figure 5:
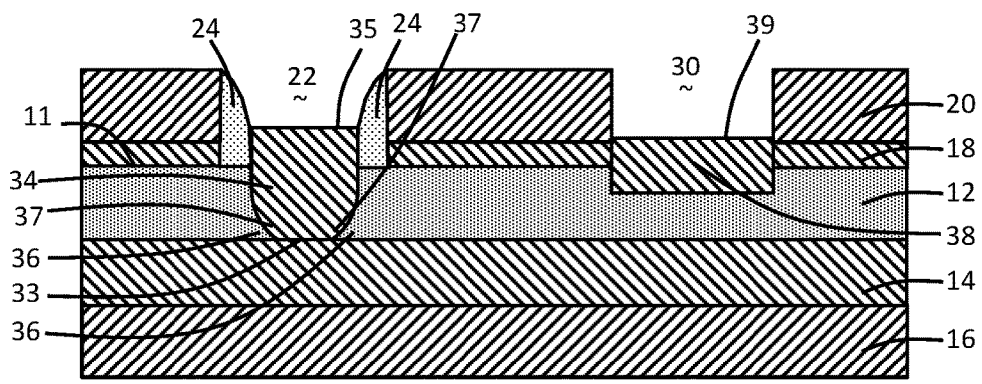

With reference to FIG. 5 in which like reference numerals refer to like features in FIG. 4 and at a subsequent fabrication stage of the processing method, the semiconductor material of the device layer 12 exposed by the trench 22 and the trench 30 may be oxidized by thermal oxidation. The pad layer 20 and the spacers 24 block oxidation of the underlying sections of the device layer 12 that are not exposed by the trenches 22, 30 so that the oxidation is localized to the area of the sections of the device layer 12 exposed by the trenches 22, 30.

A shallow trench isolation region 34 may be formed inside the trench 22 using a thermal oxidation process that oxidizes the strip 26 of the device layer 12 and the device layer 12 adjacent to the sidewalls of the trench 22. The thermal oxidation process may be a wet oxidation process that relies on steam as the oxidant or a dry oxidation process that relies on molecular oxygen as the oxidant. Thermal oxidation of the semiconductor material (e.g., silicon (Si)) may be performed at a temperature, for example, between 600° C. and 1200° C. The oxidant penetrates into the strip 26 of the device layer 12, reacts with the constituent semiconductor material (e.g., Si), and transforms it into silicon dioxide ($SiO_2$) or a non-stoichiometric oxide of silicon.

At the side edges of the strip 26 of the device layer 12 proximate to the BOX layer 14, the shallow trench isolation region 34 and the adjacent thickness of the device layer 12 develop complementary curvatures during the oxidation process as the strip 26 of the device layer 12 is oxidized and completely consumed. The shallow trench isolation region 34 has a convex curvature with curved regions 37 that curve inwardly near the BOX layer 14. Curved tail regions 36 of the device layer 12 have a concave curvature that is complementary to the curvature of the curved regions 37. A planar surface 33 of the shallow trench isolation region 34 is arranged horizontally between one of the tail regions 36 and the other of the tail regions 36. Each of the tail regions 36 tapers in height with decreasing distance from the planar surface 33.

Each of the tail regions 36 extends beneath one of the curved regions of the shallow trench isolation region 34 and is located in a vertical direction between the curved region of the shallow trench isolation region 34 and the BOX layer 14. The strip 26 of the device layer 12 may be implanted with a species (e.g., boron (B)) that increases the oxidation rate of its constituent semiconductor material such that the size of the tail regions 36 can be reduced in comparison with the size of the tail regions 36 when the strip 26 is oxidized without the prior implantation.

The shallow trench isolation region 34 extends vertically through the full thickness of the device layer 12 and terminates across its planar surface 33 on a top surface 13 (FIG. 1) of the BOX layer 14, which defines a planar interface with the device layer 12. The top surface 35 of the shallow trench isolation region 34 is located at or above a plane of the top surface 11 of the device layer 12. For example, the thermal oxidation of silicon results in a ratio for a produced volume of silicon dioxide to a consumed volume of silicon of about 2.4:1. Through selection of the thickness of the strip 26 of the device layer 12 during the partial etch through the device layer 12, the level of the top surface 35 of the shallow trench isolation region 34 relative to the top surface 11 of the device layer 12 can be controlled.

The same oxidation process oxidizes the section of the device layer 12 that is exposed over the area of trench 30, when the shallow trench isolation region 34 is formed, to form an oxide layer 38 inside the trench 30. The oxide layer 38 is composed of the same material as the shallow trench isolation region 34. The species (e.g., nitrogen (N)) implanted into the device layer 12 reduces or retards the oxidation rate of the device layer 12 over the area of the trench 30, in comparison with the strip 26 of the device layer 12 that is unimplanted. The thickness of the oxide layer 38 can be controlled through the selection of the dose of the implanted species, which regulates the modified oxidation rate. The oxygen may diffuse through the pad layer 18, if not removed from the device layer 12, inside the trench 30 in order to oxidize the semiconductor material of the device layer 12 and form the oxide layer 38. In an embodiment, the top surface 35 of the shallow trench isolation region 34 is taller than a top surface 39 of the oxide layer 38 with reference to, for example, the top surface 11 of the device layer 12.

Figure 6:
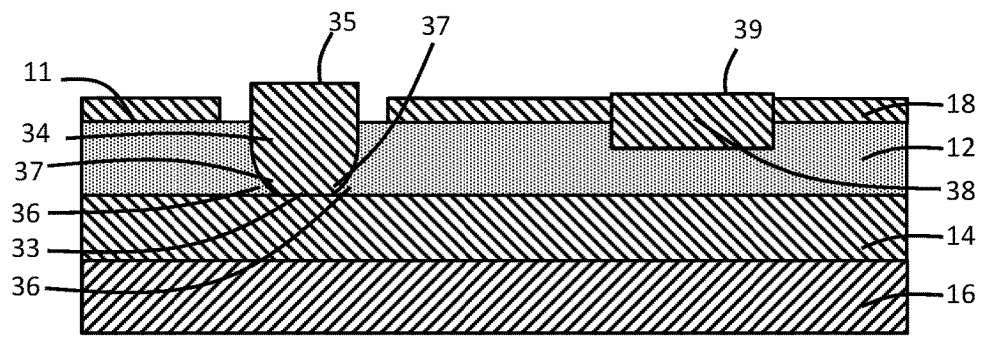

With reference to FIG. 6 in which like reference numerals refer to like features in FIG. 5 and at a subsequent fabrication stage of the processing method, the spacers 24 and the pad layer 20 are removed. Due to the height difference that may be present, the top surface 35 of the shallow trench isolation region 34 projects above a plane of the top surface 39 of the oxide layer 38.

Figure 7:
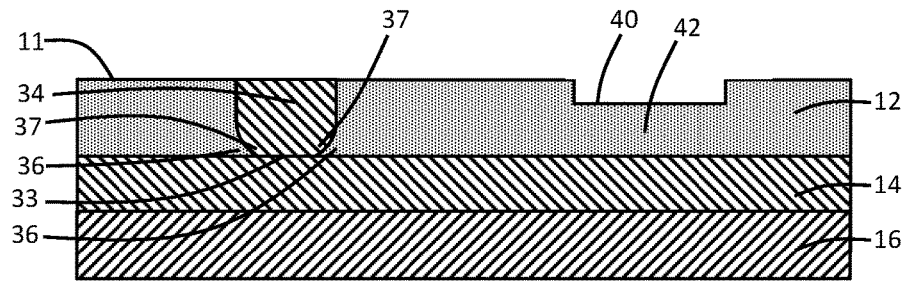

With reference to FIG. 7 in which like reference numerals refer to like features in FIG. 6 and at a subsequent fabrication stage of the processing method, the pad layer 18 is removed using a stripping or etching process. The process removing the pad layer 18 also etches back the top surface 35 of the shallow trench isolation region 34. In an embodiment, the top surface 35 of the shallow trench isolation region 34 may be coplanar with the top surface 11 of the device layer 12. The removal of the oxide layer 38 creates a recess 40 in the device layer 12 and thereby forms a thinned section 42 of the device layer 12 with a thickness that is reduced relative to the original thickness of the device layer 12 by the depth of the recess 40 relative to the top surface 11 of the device layer 12.

If nitrogen is the species implanted to reduce the oxidation rate of the section of the device layer 12 that is exposed over the area of trench 30, the thinned section 42 of the device layer 12 may be nitrided over its thickness with an accumulation and peak concentration of the nitrogen at the interface between the thinned section 42 and the BOX layer 14. The nitridation of the thinned section 42 of the device layer 12, which may operate as a body of a field-effect transistor, may reduce the diffusion of a dopant (e.g., boron) introduced into the body from the body into the BOX layer 14.

Figure 8:
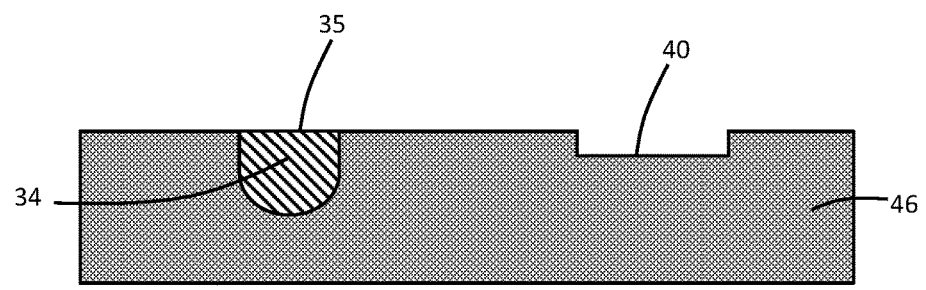
FIG. 8 is a cross-sectional view of a device structure in accordance with embodiments of the invention.

In a process simplification, the shallow trench isolation region 34 is formed in a LOCOS-like manner without the filling of a trench with deposited dielectric material (e.g., silicon dioxide) and the use of chemical-mechanical polishing to planarize the deposited dielectric material. In an alternative embodiment and as shown in FIG. 8, the shallow trench isolation region 34 and/or thinned section 42 may be provided in a bulk substrate 46.

Figure 9:
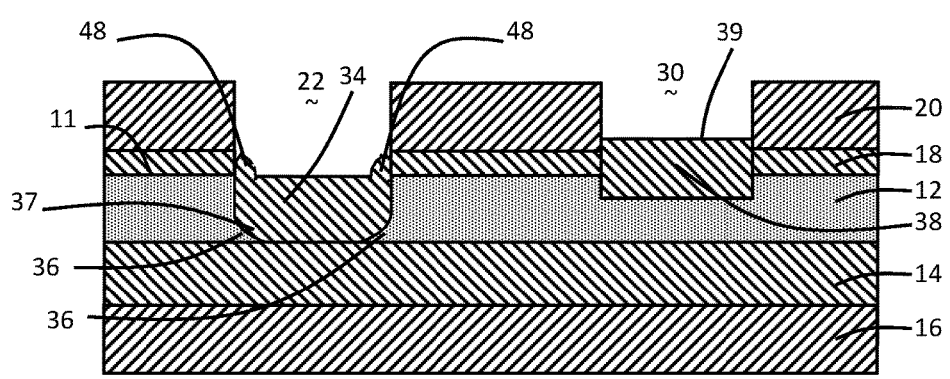
FIG. 9 is a cross-sectional view of a device structure at a fabrication stage of a processing method in accordance with embodiments of the invention.

With reference to FIG. 9 in which like reference numerals refer to like features in FIG. 1 and in accordance with embodiments of the processing method, the spacers 24 may be omitted from the trench 22 when the strip 26 is formed by the partial etching of the device layer 12 over the area of trench 22. During oxidation of the strip 26, the absence of the spacers 24 permits the formation of "bird's beaks" as projections 48 inside the trench 22 that form at the top surface of the shallow trench isolation region 34 at and near the edge of the pad layer 18. The term "bird's beak" has been coined in the art because of the shape of the projections 48. The formation of the projections 48 may reduce the depth of divots that may appear during subsequent processing in the top surface 35 of the shallow trench isolation region 34, and also increases the thickness of the shallow trench isolation region 34 at its edges.

The process flow continues as shown and described in FIGS. 6 and 7, and the projections 48 will persist in the final structure of FIG. 7.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor and/or handle wafer contact in the embodiments described herein may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a shallow trench isolation region, the method comprising:
    forming spacers on a top surface of a device layer of a silicon-on-insulator substrate, wherein the device layer is comprised of a semiconductor material and has a first thickness;
    etching a first trench into a portion of the device layer between the spacers and that includes sidewalls that extend partially through the device layer;
    etching a second trench partially through the device layer of the silicon-on-insulator substrate to expose a section of the device layer at the bottom of the second trench;
    thermally oxidizing the device layer exposed by the first trench to form a first oxide layer that extends vertically from a buried oxide layer of the silicon-on-insulator substrate through a full thickness of the device layer;
    implanting the section of the device layer with a first species that reduces an oxidation rate of the semiconductor material of the device layer; and
    thermally oxidizing a portion of the section of the device layer to thin the section of the device layer to a second thickness that is less than the first thickness and to form a second oxide layer on the section of the device layer, wherein the section of the device layer is arranged on the buried oxide layer of the silicon-on-insulator substrate, and a concentration of the first species is located at an interface between the section of the device layer and the buried oxide layer after the portion of the section of the device layer is thermally oxidized.

2. The method of claim 1 wherein the first oxide layer terminates on the buried oxide layer of the silicon-on-insulator substrate.

3. The method of claim 2 wherein the first oxide layer has curved regions that curve inwardly to intersect the buried oxide layer.

4. The method of claim 3 wherein the device layer includes a tail region that extends beneath one of the curved regions of the first oxide layer, and the tail region is located in a vertical direction between the one of the curved regions of the first oxide layer and the buried oxide layer.

5. The method of claim 4 further comprising:
    before the device layer is thermally oxidized to form the first oxide layer, implanting the device layer at the sidewalls of the first trench with a second species that increases an oxidation rate of the semiconductor material of the device layer at the sidewalls of the first trench and thereby reduces a size of the tail region.

6. The method of claim 1 wherein the first oxide layer and the second oxide layer are concurrently formed.

7. The method of claim 1 further comprising:
    removing the second oxide layer from the section of the device layer.

8. The method of claim 7 wherein the section of the device layer provides a body region for device formation.

9. The method of claim 1 wherein the first trench and the second trench extend through a plurality of pad layers formed on the device layer, and at least one of the plurality of pad layers masks underlying sections of the device layer against oxidation when the first oxide layer and the second oxide layer are formed.

10. The method of claim 1 wherein the shallow trench isolation region is formed without chemical-mechanical polishing.

11. The method of claim 1 wherein the shallow trench isolation region is formed without depositing silicon dioxide.

12. The method of claim 1 wherein the first oxide layer terminates at a planar surface with the first trench that is located at or above a plane of the top surface of the device layer.

* * * * *